United States Patent [19]
Nettles

[11] 3,978,387
[45] Aug. 31, 1976

[54] ANALOG SIGNAL COMPARATOR
[75] Inventor: Robert G. Nettles, McEwen, Tenn.
[73] Assignee: Johnson Service Company, Milwaukee, Wis.
[22] Filed: Mar. 14, 1974
[21] Appl. No.: 451,108

[52] U.S. Cl. .............................. 318/678; 318/681
[51] Int. Cl.² .......................................... G05F 1/00
[58] Field of Search .................. 318/674, 678, 681

[56]  References Cited
UNITED STATES PATENTS

| | | | |
|---|---|---|---|
| 3,260,912 | 7/1966 | Gregory | 318/678 X |
| 3,478,254 | 11/1969 | Lofrisco et al. | 318/674 X |
| 3,652,913 | 3/1972 | Leland | 318/678 |
| 3,686,557 | 8/1972 | Futumara | 318/681 |
| 3,742,327 | 6/1973 | Nettles | 318/678 |
| 3,806,787 | 4/1974 | Erler | 318/678 |
| 3,890,550 | 6/1975 | Izumi et al. | 318/681 X |

Primary Examiner—B. Dobeck
Attorney, Agent, or Firm—Johnson, Dienner, Emrich & Wagner

[57] ABSTRACT

An analog signal comparator receives a variable potential signal at each of two input ports. The signal at each input port is provided to a gate of one programmable unijunction transistor (PUT) and an anode of another PUT to form mirror-image symmetrical connections to the two PUT's. An output signal from either of the PUT's then indicates the lesser of the potentials at a corresponding one of the input terminals. The comparator is preferably intended for use in a closed-loop motor positioning system.

4 Claims, 1 Drawing Figure

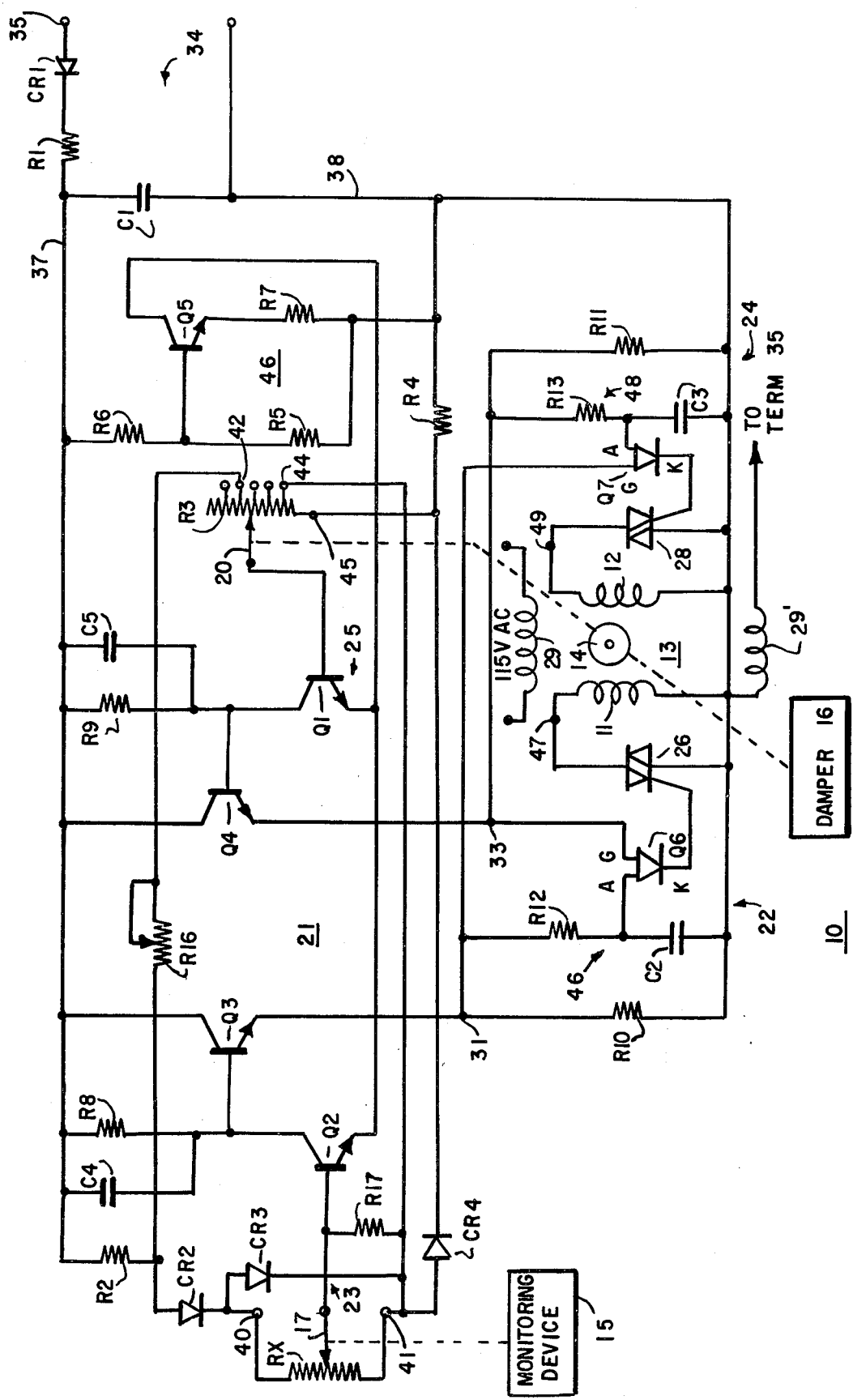

3,978,387

ANALOG SIGNAL COMPARATOR

BACKGROUND OF THE INVENTION

1. Field of the Invention

This invention relates to a circuit for comparing analog signals and, more particularly, to a circuit for determining the analog signal of the lesser potential.

2. Description of the Prior Art

Analog devices continue to find a wide variety of applications. The theoretically infinite resolution and the continuous availability of output signals are useful characteristics promoting the use of analog devices. Analog devices may be fluidic or electrical. In fluidic devices the physical continuity of the fluid lends itself to continuous control as provided by analog devices. In electrical devices, the inherent analog character of transistors facilitates the development of analog devices.

One application in which analog devices find utility is a closed-loop positioning system used, for example, in heating and air conditioning systems. In such systems a monitoring device such as bimetallic elements or diaphragm continuously monitors a selected characteristic of the system such as temperature or pressure. The monitoring device generates an analog signal representing a desired position of a motor shaft while another device coupled to the motor shaft generates an analog signal representative of the actual position of the motor shaft. If the desired and actual positions of the motor shaft do not correspond, an analog signal comparator detecting the difference generates a signal for energizing windings of the motor to rotate the shaft to the desired position. Often a motor shaft must be rotatable in both clockwise and counter-clockwise directions. Accordingly, some prior art motor actuator circuits have used electromechanical balance relays which sense both the amplitude and direction of the motor shaft excursion. However, switching the large inductive currents associated with electric motor windings causes undesirable arcing and burring at the relay contacts. Moreover, many relays are subject to power fluctuations and fatigue fractures.

To overcome the problems associated with relay motor controls as well as to improve the performance of a motor control, the inventor earlier made an invention disclosed in U.S. Pat. No. 3,742,327 issued June 26, 1973. Although the invention disclosed in the above identified patent is fully adequate for the purpose intended, the disclosed circuitry is somewhat complex and, therefore, expensive.

SUMMARY OF THE INVENTION

The present invention has provided signal comparator means for comparing first and second signals supplied to first and second input ports, respectively, of the signal comparator means to provide outputs indicating a difference between the input signal and the polarity of such difference.

The analog signal comparator means comprises an input means which receives the first and second signals and provides a potential difference between first and second outputs thereof which is indicative of the amplitude and polarity difference between the input signals. The signal comparator means further includes a detecting means having a first oscillatable means enabled whenever the potential difference between the first and second outputs exceeds a predetermined value and is of one polarity to provide a first output and a second oscillatable means enabled whenever the potential difference between the first and second outputs exceeds the predetermined value and is of the opposite polarity to provide a second output. The output provided by the detecting means in response to a given difference between the signals supplied to the signal comparator means is indicative of the magnitude and polarity of such difference.

In accordance with one embodiment of the invention, the analog signal comparator means is described with reference to an application in a motor control circuit for effecting positioning of a motor shaft at a desired position. One of the input signals is a command signal indicating a desired position for the shaft and the other input signal is a sense signal indicating the actual position of the shaft. The input means of the signal comparator means comprises a differential amplifier means having a first input connected to receive the command signal and a second input connected to receive the sense signal. Whenever the difference between the command and sense signals exceeds a predetermined amount, the differential amplifier means provides a potential difference between the first and second outputs thereof which is indicative of the amplitude and polarity difference between the command and sense signals.

The first oscillatable means of the detecting means comprises a first controlled switching device and an associated timing network and the second oscillatable means comprises a second controlled switching device and an associated timing network.

The first controlled switching device has a control circuit connected over the associated timing network between the outputs of the differential amplifier means such that whenever the potential difference between the outputs of the differential amplifier means exceeds a predetermined value and is of a first polarity, the first controlled switching means is rendered conductive periodically under the control of the associated timing network whereby the first oscillatable means provides a series of output pulses at a frequency determined by the timing network.

Similarly, the second controlled switching device has a control circuit connected over the associated timing network between the outputs of the differential amplifier means such that whenever the potential difference between the outputs of the differential amplifier means exceeds the predetermined value and is of the opposite polarity, the second controlled switching device is rendered conductive periodically under the control of the associated timing network whereby the second oscillatable means provides a different series of output pulses at a frequency determined by the timing network.

The series of output pulses provided by either the first oscillatable means or the second oscillatable means are used to control the motor to effect rotation or counterclockwise rotation of the motor shaft. The motor shaft is linked to a suitable sense controller means to effect a change in the sense signal with rotation of the motor shaft to thereby compensate for the difference between the command and sense signals as the motor shaft is rotated to the desired position. Accordingly, when the motor shaft has been rotated to the desired position, the sense signal will be approximately equal to the command signal whereby the potential difference at the outputs of the differential amplifier means will be below the predetermined value such that the first and second oscillatable means will be disabled thereby removing drive from the motor.

DESCRIPTION OF THE DRAWING

A preferred embodiment which is intended to illustrate and not limit the invention will now be described with reference to the drawing which is a schematic circuit diagram of the embodiment.

DESCRITION OF A PREFERRED EMBODIMENT

Referring to the drawing, there is shown in schematic circuit diagram for an analog signal comparator circuit 10 provided by the present invention. By way of illustration, the analog signal comparator circuit 10 is described with reference to an application in a closed-loop control system to effect positioning of the shaft or rotor 14 of a motor 13. For example, in a heating and air conditioning system, the motor may provide controlled positioning of a damper 16 which may be located in a heating or cooling duct (not shown) which supplies warm or cool air to an enclosure. The damper 16 is driven by the motor shaft 14 as a function of a command provided to the signal comparator circuit 10 by way of an analog monitoring device 15 which may be a bi-metallic element or a diaphram located in the enclosure, which continuously monitors a selected characteristic of the system, such as temperature within the enclosure.

The monitoring device 15 is mechanically linked to a wiper 17 of a command potentiometer RX which is connected between a voltage source such that in response to a change in temperature, for example, the potential or command signal at the wiper 17 is indicative of the position required for the damper 16 to permit sufficient warm or cool air to be admitted into the enclosure to compensate for the temperature change.

A follow-up potentiometer R3 connected between the voltage source has a wiper 20 mechanically linked to the motor shaft 14 such that the potential or sense signal at the wiper 20 is indicative of the actual position of the motor shaft 14 and correspondingly the position of the damper 16 which is driven by the motor shaft 14. The command and sense signals thus provided are extended to input ports 23 and 25, respectively of the signal comparator circuit 10.

As shown in the drawing, the signal comparator circuit 10 comprises a differential amplifier 21 including transistors Q1 through Q5, a pair of detecting stages 22 and 24, including programmable unijunction transistors Q6 and Q7, respectively, and a pair of output switching devices 26 and 28, embodied as Triacs, which control the operation of the motor 13. In an exemplary embodiment, the motor 13 may be a conventional shaded pole motor having a main winding 29 and a pair of shading coils 11 and 12. The Triac devices 26 and 28 are selectively operable to short-circuit the shading coils 11 and 12, respectively to permit counter-clockwise or clockwise rotation of the motor shaft 14.

The command and sense signals provided at the wipers 17 and 20 of potentiometers RX and R3, respectively, are extended to input ports 23 and 25, respectively of the signal comparator circuit 10. The differential amplifier 21 is operable to compare the command and sense signals and provide a potential difference between a pair of outputs, points 31 and 33 of the differential amplifier 21. The detecting circuits 22 and 24 are responsive to such potential difference to effect selective enabling of either Triac 26 or 28 in accordance with the difference in amplitude and polarity of the command and sense signals to control the operation of the motor 13.

When the command and sense signals supplied to the input ports 23 and 25 are equal, the motor shaft 14 is at the desired position. When the command and sense signals provided to the input ports 23 and 25 are not equal due to movement of the wiper 17 of the command potentiometer RX by the monitoring device 15, the potential difference provided between points 31 and 33 enables either PUT device Q6 or PUT device Q7 to cause either Triac 26 or 28 to be rendered conductive, when Triac 26 is conductive, shading coil 11 is short-circuited so as to effect counter-clockwise rotation of the motor shaft 14. On the other hand, when Triac 28 is conductive, shading coil 12 is short-circuited so that clockwise rotation of the motor shaft is effected. The direction of rotation required to move the motor shaft 14 toward the desired position is determined by the differential amplifier 21 which senses the polarity of the difference between the command and sense signals at input ports 23 and 25 of the signal comparator circuit 10. When the main motor winding 29 is energized the motor shaft 14 is rotated in a direction and an amount necessary to move the wiper 20 of potentiometer R3 until correspondance between the command and sense signals received at the input ports 23 and 25 is achieved.

The signal comparator circuit 10 further includes a power supply circuit, indicated generally at 34 which supplies DC power to the signal comparator circuit 10 over conductor 37 and a common conductor 38. The power supply 34 has a terminal 35 connected to an AC source which, for example, may be 24 volts AC from a tertiary winding 29' of the motor 13, operated from the main winding 29 of the motor. The power supply circuit 34 includes a rectifying diode CR1 and a current limiting resistor R1 which are connected between input terminal 35 and conductor 37 and a filter capacitor C1 which is connected between conductors 37 and 38. Accordingly, the power supply circuit 34 supplies half-wave rectified DC power to the circuit over conductors 37 and 38.

Detailed Description

A reference voltage is supplied to the command potentiometer RX and the follow-up potentiometer R3 by way of resistor R2 and diodes CR2, CR3 and CR4, and resistor R4, which are serially connected between conductors 37 and 38. The command potentiometer RX has one tap 40 connected between the junction of diodes CR2 and CR3 and a further tap 41 connected between the junction of diodes CR3 and CR4. Diode CR3 provides a constant voltage between terminals 40 and 41 to energize potentiometer RX. The common junction of diodes CR3 and CR4, tap 44 of potentiometer RX and tap 41 of potentiometer RX provide a common fixed reference position for the actuator. The wiper 17 of potentiometer RX is connected to the base of transistor Q2 at input port 23 of the signal comparator circuit 10.

The follow-up potentiometer R3 has a first tap 42 connected over a potentiometer R16 to the junction of resistor R2 and diode CR2 and a further tap 44 connected to the junction of diodes CR3 and CR4. The combined voltage across diodes CR3 and CR4 is applied to resistors R3 and R16. Resistor R16 is adjustable to provide the potential to follow-up potentiometer R3 that is required for the desired rotation of the motor shaft 14 or actuator travel span. The follow-up potentiometer R3 has a further tap 45 connected to the junction of diode CR4 and resistor R4 to provide a high voltage gradient to stop rotation of the motor shaft 14 at its fixed rotation limit. The diode CR4 provides a reversing voltage should the actuator overrun its fixed position.

As can be seen in the drawing, when the resistor R16 is set for minimum resistance, the potential across the follow-up potentiometer R3 is greater than the potential across the command potentiometer RX due to the drop across diode CR2. The resistor R16 can be adjusted to provide a potential across the follow-up potentiometer R3 that is required to effect desired rotation of the motor shaft 14.

Moreover, the tap 45 of the follow-up potentiometer R3 is at a lower potential than the tap 41 of the command potentiometer RX due to the voltage drop across diode CR4 to provide a voltage gradient for the sense or follow-up potentiometer R3 positioned to stop the motor shaft 14 at its fixed rotation limit when a minimum command signal is supplied to the signal comparator circuit 10.

In the exemplary system, DC command and sense signals are provided and the differential amplifier 21 is responsive to DC input signals to provide control for the motor 13. The command signal provided at wiper 17 of potentiometer RX is extended to the base of transistor Q2 which serves as one input to the differential amplifier 21. A resistor R17 is connected between the base of transistor Q2 and a terminal of the command potentiometer RX. The collector of transistor Q2 is connected over resistor R8 to conductor 37. A capacitor C4 is connected in parallel with resistor R8. The sense signal provided at wiper 20 of potentiometer R3 is extended to the base of transistor Q1 which serves as the second input of the differential amplifier 21. The collector of transistor Q1 is connected over resistor R9 to conductor 37. A capacitor C5 is connected in parallel with resistor R9.

The emitters of transistors Q1 and Q2 are connected to the collector of transistor Q5 which comprises a constant current source 46, including transistor Q5 and resistors R5–R7 which set the source current. Resistors R5 and R6 are connected in series between conductors 37 and 38 and the base of transistor Q5 is connected to the junction of resistors R5 and R6. The emitter of transistor Q5 is connected to conductor 38 over resistor R7.

Transistors Q1 and Q2 are both biased to be normally conducting. Accordingly, when the command and sense signals provided by the command potentiometer RX and the follow-up potentiometer R3 are equal, transistors Q1 and Q2 share the current from the current source 46 equally and the potentials at the collectors of transistors Q1 and Q2 are equal. However, when the input voltages are unequal, current division occurs and consequently, the collector potentials are unequal so that a differential voltage proportional to the difference in the command and sense signals exists between the collectors of transistors Q3 and Q4.

The collectors of transistors Q1 and Q2 are connected to the bases of transistors Q4 and Q3, respectively, which are connected in emitter-follower configuration and serve to provide a low impedance drive between differential amplifier 21 and the detector circuits 22 and 24. The common emitter stages provide a more reliable operation by increasing input impedance and lowering output impedance between the differential amplifier and the detecting stages.

The collectors of transistors Q3 and Q4 are connected to conductor 37 and the emitters of transistors Q3 and Q4 are connected to points 31 and 33, respectively, and to conductor 38 over resistors R10 and R11, respectively.

The potential difference provided between the emitters of transistors Q3 and Q4 (at points 31 and 33) is used to control the conductivity of the programmable unijunction transistors Q6 and Q7, which comprise the detecting circuits 22 and 24 respectively. The programmable unijunction transistors may be the type 2N6027 commercially available from General Electric Company, Motorola, or other Semiconductor manufacturers.

As will become apparent, the PUT devices Q6 and Q7 have anode and gate electrodes inversely connected to outputs of the differential amplifier 21 at points 31 and 33 in mirror-image symmetry such that whenever the potential difference between points 31 and 33 is sufficient to effect turnon of one of the PUT devices, such as PUT device Q6 for example, such potential reverse biases the other PUT device Q7 maintaining PUT device Q7 non-conductive.

Detecting stage 22 includes an RC network 46 which is comprised of a resistor R12 and a capacitor C2 which are serially connected in parallel with resistor R10 between the emitter of transistor Q3 and conductor 38. The anode of PUT device Q6 is connected to the junction of resistor R12 and capacitor C2. The gate of the PUT device Q6 is connected directly to the emitter of transistor Q4 and the cathode of PUT device Q6 is connected to the gate of a Triac 26 which controls the shorting of shading coil 11 of the motor 13 to enable counter-clockwise rotation of the motor shaft 14. The Triac 26 is connected between conductor 38 and a terminal 47 of the motor 13.

Similarly, detecting stage 24 includes a further RC network 48 comprised of a resistor R13 and a capacitor C3 which are serially connected in parallel with resistor R11 between the emitter of transistor Q4 and conductor 38. The PUT device Q7 has an anode connected to the junction of resistor R13 and capacitor C3. The gate of the PUT device Q7 is connected directly to the emitter of transistor Q3, and the cathode of the PUT device Q7 is connected to the gate of Triac 28 which controls the shorting of shading coil 12 of the motor 13 to enable clockwise rotation of the motor shaft 14. Triac 28 is connected between conductor 38 and a terminal 49 of the motor 13.

The PUT device Q6 and Q7 which provide gating signals for associated Triac devices 26 and 28, respectively are both normally non-conducting whenever the potential at a corresponding gate electrode is greater than or equal to the potential at the anode electrode. Controlling voltages for the PUT devices Q6 and Q7 are provided by associated RC networks 46 and 48 in a manner to be described hereinafter.

Whenever a potential difference occurs between points 31 and 33 (as the result of a difference in the command and sense signals) such that the anode voltage exceeds the gate voltage for one of the PUT devices, such as PUT device Q6, the PUT device Q6 is controlled by the associated RC network 46 to be operable as an oscillator circuit to furnish a series of high energy pulses to Triac 26 at a frequency determined by the RC time constant of the network 46 to enable shorting of the motor shading coil 11 to effect counter-clockwise rotation of the motor shaft 14. The frequency of the pulses is high enough to gate the Triac 26 into full wave conduction in normal operation.

Likewise, PUT device Q7 and its associated RC network 48 is also operable as an oscillator circuit to supply control pulses to Triac 28 to enable shorting of the motor shading coil 12 to effect clockwise rotation of the motor shaft 14 whenever the difference between the command and sense signals is of the opposite polarity.

OPERATION OF THE SIGNAL COMPARATOR CIRCUIT

When the motor shaft 14 is at the desired position, the signal comparator circuit 10 is in a balanced condition, and the sense signal provided at the wiper 20 at the follow-up potentiometer R3 is approximately equal to the command signal provided at the wiper 17 of the command potentiometer RX. In such condition, the potential difference appearing between the emitters of transistors Q3 and Q4 is insufficient to cause either PUT device Q6 or Q7 to be rendered conductive. Consequently, Triacs 26 and 28 are also non-conductive such that the shading coils 11 and 12 are not short-circuited.

In accordance with the present example, when the analog sensing device 14 detects a change in temperature, the sensing device 15 moves the wiper 17 of the command potentiometer RX an amount corresponding to the change causing an increase or decrease in the potential at the wiper 17 of the potentiometer RX. This change in potential indicates the direction of rotation and the amount of rotation required for the motor shaft 14 to position the damper 16 to effect compensation for the change in temperature.

It is pointed out that the potential at the wiper 17 of potentiometer RX is more negative than the potential at the terminal 40 of the potentiometer RX. Thus, when the wiper 17 is moved in the direction of terminal 41 to increase the potential difference between the wiper 17 and the terminal 40, the potential at the wiper 17 changes in a negative direction. Accordingly, the potential at the base of transistor Q2 also becomes more negative so that transistor Q2 draws less emitter current than transistor Q1. Consequently, the voltage at the collector of transistor Q2 becomes greater than the voltage at the collector of transistor Q1. Correspondingly, the emitter potential of the transistor Q3 increases relative to the emitter potential transistor Q4. As the potential at the emitter of transistor Q3 increases relative to the potential on conductor 38, capacitor C2 begins to charge to the potential at the emitter of transistor Q3. When the potential at the anode of PUT device Q6 becomes greater than the potential at the gate of the PUT device Q6, the PUT device Q6 is rendered conductive enabling capacitor C2 to discharge over the anode-to-cathode circuit of the PUT device Q6 providing a first high energy pulse to the gate of the Triac 26. Triac 26 responsively becomes conductive, connecting motor terminal 47 to conductor 38 to short shading coil 11.

The PUT device Q7 is maintained non-conducting at such time since the potential at point 31, which is connected to the gate of the PUT device Q7, is greater than the potential at point 33 which is connected to the anode of the PUT device Q7.

With the motor winding 29 energized and shading coil 11 shorted out, the shaft 14 is rotated counter-clockwise a predetermined increment corresponding to the duration for which the shader winding 11 is shorted. As the motor shaft 14 rotates, the wiper 20 of the follow-up potentiometer R3 is moved in a direction corresponding to the rotation of the motor shaft 14 causing a change in the potential difference supplied between the input ports 23 and 25 of the differential amplifier 21.

As capacitor C2 discharges over the anode-to-cathode circuit of the PUT device Q6, the PUT device Q6 is rendered non-conductive when the potential across capacitor C2 decreases to a value such that the anode potential of PUT device Q6 becomes equal to or less than the gate potential for the PUT device Q6. At such time, the device Q6 is rendered non-conductive, removing the gate signal from Triac 26. The Triac 26 remains conductive for the duration of the half cycle of main terminal current flow.

Assuming the movement of the wiper 20 of the follow-up potentiometer R3 was insufficient to create a balance for the signal supplied to the input ports 23 and 25 of the differential amplifier 21, the continuing difference in potential between the emitters of transistors Q3 and Q4 permits capacitor C2 to again charge to a value sufficient to render PUT device Q6 conductive to supply further gating pulses to Triac 26, causing the motor shading coil 11 to be short circuited and providing further incremental rotation of the shaft 14. The detecting circuit 22 continues to oscillate furnishing a series of high energy pulses to the Triac 26 causing continued rotation of the shaft 14 in a counter-clockwise direction and moving the wiper 20 of the follow-up potentiometer R3 until the wiper 20 has been moved sufficiently to achieve a balanced condition for the command and sense signals. When the input signals supplied to the input ports 23 and 25 of the differential amplifier 21 are approximately equal, the potential difference between the emitters of transistors Q3 and Q4 is approximately zero and further operation of the motor is inhibited.

The operation of the signal comparator circuit 10 to provide clockwise rotation of the motor shaft 14 is similar to the operation of the comparator circuit 10 described above to effect counter-clockwise rotation of the motor shaft 14. Whenever a positive going command signal is provided by the command potentiometer RX, the potential at the base of transistor Q2 becomes more positive than the potential at the base of transistor Q1 causing the potential at the emitter of transistor Q4 to increase relative to the potential at the emitter of transistor Q3. Such potential difference is effective to enable the PUT device Q7 and the associated RC network 46 to be operable as an oscillating circuit to furnish a series of high energy pulses to the gate of Triac 28, thereby periodically connecting motor terminal 49 to conductor 38. Accordingly, the shading coil 12 is shorted out to effect clockwise rotation of the motor shaft 14.

With the main motor winding 29 energized and shading coil 12 shorted out, the motor shaft 14 is rotated clockwise moving the wiper 20 of the follow-up potentiometer R3 to increase the potential at the base of transistor Q1 until the potential at the base of transistor Q1 is approximately equal to the potential at the base of transistor Q2 at which time the motor is deenergized and the comparator circuit 10 assumes a balanced condition.

While a preferred embodiment of the analog signal comparator circuit 10 has been described with reference to an application in a heating and air conditioning system, it is apparent that the signal comparator circuit may be employed in various other types of control systems. Moreover, although in the exemplary embodiment, the signal comparator circuit is used to control a shaded pole motor to effect selective short-circuiting of shading coils of the motor, with suitable modifications, which will be apparent to those skilled in the art, the signal comparator circuit may be used to control a wide variety of motors or other controllable devices.

Finally, it is pointed out that the DC sensing employed in the illustrative embodiment for the signal comparator circuit 10 allows for computer control of the command function or the use of a DC reset function in certain applications.

I claim:

1. In a motor control circuit for effecting positioning of a motor shaft, analog signal comparator means comprising input means having a first input for receiving a command signal indicative of a desired position for the shaft and a second input for receiving a sense signal indicative of the actual position of the shaft, said input means being responsive to a difference between said command and sense signals to provide a potential difference between first and second outputs thereof of an amplitude and polarity that is indicative of the difference between said command and sense signals, first oscillatable means including a first programmable unijunction transistor and first timing means, said first programmable unijunction transistor having a gate electrode connected to the first output and an anode electrode connected over said first timing means to said second output, said first oscillatable means being enabled whenever the potential difference between said first and second outputs exceeds a predetermined value and is of a first polarity to provide a series of output pulses, second oscillatable means including a second programmable unijunction transistor and a second timing means, said second programmable unijunction transistor having a gate electrode connected to said second output and an anode electrode connected over said second timing means to said first output, said second oscillatable means being enabled whenever the potential difference provided between said first and second outputs exceeds said predetermined value and is of the opposite polarity to provide a series of output pulses, and output means responsive to the series of output pulses provided by said first oscillatable means to control the motor to effect rotation of the motor shaft in one direction, said output means being responsive to the series of output pulses provided by said second oscillatable means to effect rotation of the motor shaft in the opposite direction.

2. A motor control circuit as set forth in claim 1 wherein said first timing means comprises a first resistor means and a first capacitor means serially connected between said second output and a point of reference potential, said first programmable unijunction transistor means having its anode electrode connected to the junction of said resistor means and said capacitor means, and wherein said second timing means comprises second resistance means and second capacitance means serially connected between said first output and said point of reference potential, said second programmable unijunction transistor means having its anode electrode connected to the junction of said resistance means and said capacitance means, said first capacitance means being enabled to charge to a value sufficient to render said first programmable unijunction transistor means conductive to permit said first capacitance means to discharge over said programmable unijunction transistor means to provide a pulse output whenever the potential difference between said first and second outputs exceeds said predetermined value and is of said first polarity, and said second capacitance means being enabled to charge to a value sufficient to render said second programmable unijunction transistor means conductive to permit said second capacitance means to discharge over said second programmable unijunction transistor means to provide a pulse output whenever the potential difference provided between said first and second outputs exceeds said predetermined value and is of said opposite polarity.

3. A motor control circuit as set forth in claim 2 wherein said output means includes first switching means responsive to output pulses provided by said first programmable unijunction transistor means to effect rotation of said motor shaft in said one direction, and second switching means responsive to the output pulses provided by said second programmable unijunction transistor means to effect rotation of said motor shaft in the opposite direction.

4. In a motor control circuit for controlling a motor to effect the positioning of a shaft of the motor to a desired position, an analog signal comparator means comprising differential amplifier means, first means electrically connected to a first input of said differential amplifier means for providing a command signal indicating a desired position for said motor shaft, second means electrically connected to a second input of said differential amplifier means for supplying a sense signal indicative of the actual position of said motor shaft, said differential amplifier means being responsive to a difference in the command and sense signals to provide a potential difference between first and second outputs thereof which is of an amplitude and polarity indicative of the difference between said command and sense signals, first detecting means having a first input connected to said first output of said differential means and a second input connected to said second output of said differential amplifier means, second detecting means having a third input connected to said first output of said differential amplifier means and a fourth input connected to said second output of said differential amplifier means, said first detecting means including first programmable unijunction transistor means and first timing means operable to periodically enable said first programmable unijunction transistor means to provide a series of control pulses whenever the potential difference between said first and second outputs exceeds a predetermined value and is of a first polarity, said second detecting means including second programmable unijunction transistor means and second timing means operable to periodically enable said second programmable unijunction transistor means to provide a series of control pulses, whenever the potential difference between said first and second outputs exceeds said predetermined value and is of the opposite polarity and output means including first switching means controlled by the control pulses provided by said first programmable unijunction transistor means to effect rotation of said motor shaft in one direction and second switching means controlled by the control pulses provided by said second programmable unijunction transistor means to effect rotation of said motor shaft in the opposite direction.

* * * * *